(12) United States Patent
Hervé

(10) Patent No.: US 10,735,021 B2
(45) Date of Patent: Aug. 4, 2020

(54) CORRECTION OF MISMATCH ERRORS IN A MULTI-BIT DELTA-SIGMA MODULATOR

(71) Applicant: SCALINX, Paris (FR)

(72) Inventor: Marie Hervé, Ver sur Mer (FR)

(73) Assignee: SCALINX, Paris (FR)

( * ) Notice: Subject to any disclaimer, the term of this patent is extended or adjusted under 35 U.S.C. 154(b) by 0 days.

(21) Appl. No.: 16/532,198

(22) Filed: Aug. 5, 2019

(65) Prior Publication Data

US 2020/0067521 A1    Feb. 27, 2020

(30) Foreign Application Priority Data

Aug. 22, 2018   (FR) ...................... 18 57592

(51) Int. Cl.
*H03M 3/00*       (2006.01)

(52) U.S. Cl.
CPC ........... *H03M 3/384* (2013.01); *H03M 3/464* (2013.01)

(58) Field of Classification Search
CPC ...... H03M 3/384; H03M 3/464; H03M 3/424; H03M 3/388; H03M 1/12; H03M 13/30; H03M 3/50; H03M 7/3004
USPC .................................................. 341/155, 143
See application file for complete search history.

(56) References Cited

U.S. PATENT DOCUMENTS

| | | | |
|---|---|---|---|
| 8,791,846 B2* | 7/2014 | Cho ........................ | H03M 3/38 341/118 |
| 9,007,242 B2* | 4/2015 | Lin ........................ | H03M 3/368 341/120 |
| 9,513,651 B2* | 12/2016 | Ahmed ...................... | G05F 3/02 |
| 9,906,237 B1* | 2/2018 | Venkataraman ........ | H03M 3/50 |
| 2014/0022102 A1* | 1/2014 | Cho ......................... | H03M 3/38 341/120 |
| 2015/0002325 A1* | 1/2015 | Lin .......................... | H03M 3/50 341/143 |

OTHER PUBLICATIONS 19186247.3, Extended European Search Report, dated Dec. 20, 2019, 11 pages.
Witte, et al., "A Correlation-Based Background Error Estimation Technique for Bandpass Delta-Signma ADC DACs", IEEE Transactions on Circuits and Systems—II: Express Briefs, vol. 58, No. 11, Nov. 2011, pp. 748-752.
Witte, et al., "An Error Estimation Technique for Lowpass and Bandpass $\Delta\Sigma$ ADC Feedback DACs Using a Residual Test Signal", IEEE, 2012, pp. 73-76.

(Continued)

*Primary Examiner* — Jean B Jeanglaude
(74) *Attorney, Agent, or Firm* — Stoel Rives LLP

(57) ABSTRACT

A method for calibrating a multi-bit Delta-Sigma modulator is disclosed herein. The method includes at least one main multi-bit digital-analogue converter in a return loop for generating a return signal subtracted from an input of the modulator. The main converter includes a plurality of elementary source cells at least some of which, referred to as active cells, are associated with the various input bits of the converter for generating the return signal. The output level of these active source cells is adjustable under the action of a matching signal that comes from a calibration circuit receiving an output signal from the modulator at its input. The calibration circuit includes a generator of a calibration sequence.

15 Claims, 4 Drawing Sheets

(56) References Cited

OTHER PUBLICATIONS

Fattaruso, et al., "Self-Calibration Techniques for a Second-Order Multibit Sigma-Delta Modulator", IEEE Journal of Solid-State Circuits, vol. 28, No. 12, Dec. 1993, pp. 1216-1223.
Kauffman, et al., "A72dBDR,CT ΔΣ Modulator Using Digitally Estimated, Auxiliary DAC Linearization Achieving 88 fJ/conv-step in a 25 MHz BW", IEEE Journal of Solid-State Circuits, vol. 49, No. 2,, Feb. 2014, pp. 392-404.
Kauffman, et al., "An 8.5 mW Continuous-Time ΔΣ Modulator With 25 MHz Bandwidth Using Digital Background DAC Linearization to Achieve 63.5 dB SNDR and 81 dB SFDR", IEEE Journal of Solid-State Circuits, vol. 46, No. 12, Dec. 2011, pp. 2869-2881.
Manoli, "A Self-Calibration Method for Fast High-Resolution A/D and D/A Converters", IEEE Journal of Solid-State Circuits, vol. 24, No. 3, Jun. 1989, pp. 603-608.
Witte, et al., "Background DAC Error Estimation Using a Pseudo Random Noise Based Correlation Technique for Sigma-Delta Analog-to-Digital Converters", IEEE Transactions on Circuits and Systems—I: Regular Papers, vol. 57, No. 7,, Jul. 2010, pp. 1500-1512.
Yan, et al., "A Continuous-Time ΔΣ Modulator With 88-dB Dynamic Range and 1.1-MHz Signal Bandwidth", IEEE Journal of Solid-State Circuits, vol. 39, No. 1, Jan. 2004, pp. 75-86.

\* cited by examiner

| c \ l | 6 | 5 | 4 | 3 | 2 | 1 |
|---|---|---|---|---|---|---|
|  | ⊗ | ⊗ | ⊗ | ⊗ | ⊗ | ⊗ |
| 1 | $\overline{pr}$ | D3 | D2 | pr | D1 | D0 |
| 2 | $\overline{pr}$ | D3 | pr | D2 | D1 | D0 |
| 3 | $\overline{pr}$ | pr | D3 | D2 | D1 | D0 |

CORRECTION OF MISMATCH ERRORS IN A MULTI-BIT DELTA-SIGMA MODULATOR

RELATED APPLICATION(S)

This application claims priority to France Patent Application No. 1857592, filed Aug. 22, 2018, and entitled "CORRECTION OF MISMATCHED ERRORS IN A MULTI-BIT DELTA-SIGMA MODULATOR" which is herein incorporated by reference in its entirety.

FIELD OF THE INVENTION

The present invention relates to the correction of mismatch errors in a multi-bit Delta-Sigma modulator.

BACKGROUND OF THE INVENTION

A Delta-Sigma modulator conventionally comprises an analogue loop filter, which may notably be low-pass, high-pass or bandpass, followed by an analogue-digital converter. The modulator also comprises at least one return digital-analogue converter. This converter comprises, in the case of a multi-bit modulator, several current or voltage sources, having mismatch errors, where these errors may vary depending on the environmental conditions: temperature, power supply voltage, or aging of the components.

The interest of a Delta-Sigma modulator resides in its high output resolution possible (up to 16, 24, 32 bits, or even more) for input signals with a moderate bandwidth. However, in a multi-bit Delta-Sigma modulator, the performance characteristics are limited by the mismatch errors of the return digital-analogue converter.

Various techniques are known for improving the linearity of the return digital-analogue converter.

The IEEE article by Bolatkale et al., entitled "A 4 GHz Continuous-Time $\Delta\Sigma$ ADC with 70 dB DR and −74 dBFS THD in 125 MHz BW", provides a multi-bit return digital-analogue converter whose unit cells are dimensioned so as to minimize the mismatch error. Since the matching precision is reduced in proportion to the square root of the surface area of the unit cells, such an implementation leads to circuits with a large size, reduced speed and high power consumption.

Another known solution is to use mixing techniques, notably the DEM (Dynamic Element Matching) technique, in the multi-bit return digital-analogue converter. This technique consists in dynamically interchanging the selection of the unit cells of the converter in order to average the mismatch error noise. The DEM technique is not efficient at low over-sampling factors. Moreover, the digital circuit required for implementing the DEM technique adds latency on the path between the analogue-digital converter and the return digital-analogue converter, increasing the time constant of the loop and thus adversely affecting the speed of the clock and the bandwidth of the signal. Lastly, the DEM technique increases the number of switching operations of the unit cells which renders the digital-analogue converter of the return loop more vulnerable to transient errors.

Another solution for improving the linearity of the return digital-analogue converter is to calibrate its unit cells at start-up, as is the case in the IEEE article by Y. Dong et al., entitled "A 72 dB-DR 465 MHz-BW Continuous-Time 1-2 MASH ADC in 28 nm CMOS". This solution is not very robust because the environmental conditions, together with the characteristics of the unit cells, vary over time. This correction technique furthermore imposes that the modulator be in standby mode during the calibration.

In the IEEE articles by P. Witte et al., entitled "Background DAC Error Estimation Using a Pseudo Random Noise Based Correlation Technique for Sigma-Delta Analog-to-Digital Converters" and J. G. Kauffman et al., entitled "An 8.5 mW Continuous-Time $\Delta\Sigma$ Modulator With 25 MHz Bandwidth Using Digital Background DAC Linearization to Achieve 63.5 dB SNDR and 81 dB SFDR", an online correction circuit for the unit cells of the multi-bit return digital-analogue converter is provided. A test unit cell is added and controlled by a pseudo-random binary sequence. The mismatch error is detected by a crossed correlation between the output of the modulator and the pseudo-random binary sequence. The precision of the correction is limited because the mismatch errors are not addressed at the source but in the digital domain. Furthermore, the pseudo-random signal is not perfectly subtracted in the digital domain and hence adds noise to the useful signal. The dynamic range of the modulator is also reduced due to the added pseudo-random signal, and the correction circuit consumes a significant amount of power degrading the energy efficiency of the modulator.

In the IEEE article by Kauffman et al. "A 72 dB DR, CT $\Delta\Sigma$ Modulator Using Digitally Estimated, Auxiliary DAC Linearization Achieving 88 fJ/conv-step in a 25 MHz BW", the authors add to the return digital-analogue converter an auxiliary digital-analogue converter which compensates the non-linearity of the main converter. However, since the compensation is applied for each mismatch error of the unit cells, this raises several difficulties:

- the precision of the correction depends on the linearity of the auxiliary converter,
- a fast LUT (Look Up Table) is required,
- the auxiliary converter operates at a fraction of the dynamic range of the main converter and the mismatch error between the two is non-negligible.

In the IEEE article by K. Falakshahi et al., entitled "A 14-bit, 10-Msamples/s D/A Converter Using Multibit $\Sigma\Delta$ Modulation", the idea of the authors is to calibrate the unit cells of the return digital-analogue converter by storing a reference voltage in a capacitor. Owing to the leakage currents at the drain-substrate junctions, the calibration needs to be continually refreshed. In addition, the injection of charges due to the switching of the calibration selector switches degrades the precision of the voltage across the terminals of the capacitor. Furthermore, a three-channel selector switch is needed, the third channel being allocated to the calibration, complicating the implementation of the circuit and limiting its performance.

There exists a need to further improve Delta-Sigma modulators for correcting the mismatch errors, while at the same time maintaining good performance characteristics, notably in terms of precision, of speed and of energy consumption.

SUMMARY OF THE INVENTION

The invention aims to meet this need, and does so by virtue of a method for calibrating a multi-bit Delta-Sigma modulator comprising a main return loop multi-bit digital-analogue converter for generating a return signal subtracted from the input of the modulator, the main converter comprising a plurality of elementary source cells at least some of which, referred to as active cells, are associated with the various input bits of the converter for generating the return signal, the output level of these active source cells being adjustable under the action of a matching signal, the matching signal coming from a calibration circuit receiving an output signal from the modulator at its input, this calibration circuit comprising a generator of a calibration sequence.

According to an aspect of the invention, there is provided a method for calibrating a multi-bit Delta-Sigma modulator comprising at least one main multi-bit digital-analogue converter in a return loop for generating a modulator return signal to be subtracted from an input of the modulator, the main converter comprising a plurality of elementary source cells, at least some of which, referred to as active cells, are associated with a plurality of input bits of the converter coupled to an output signal of the modulator for generating the modulator return signal, the output level of the active source cells being adjustable under the action of a matching signal, the matching signal coming from a calibration circuit that receives the output signal from the modulator at its input, the calibration circuit comprising a generator of a calibration sequence, method in which, given a reference cell, a cell to be calibrated is selected from amongst the active source cells, the selected source cell and the reference cell being controlled by complementary signals based on the calibration sequence in such a manner as to inject into the modulator return signal a calibration signal whose amplitude decreases with the matching between the selected source cell and the reference cell thus controlled, and in which the matching signal sent to the selected source cell to be calibrated is generated by processing of the output signal of the modulator and of the calibration sequence in such a manner as to make the amplitude of the injected calibration signal converge towards a predefined limit value.

Thanks to the invention, a significant improvement, both in the signal-to-noise ratio and in the harmonic distortion rate of the Delta-Sigma modulator may be obtained.

If desirable, the invention allows the calibration as a background task of the return digital-analogue converter, simultaneously with the usual operation of the modulator.

The additional circuitry required for the implementation of the invention is relatively insignificant.

The invention allows the use of smaller components because the mismatch errors resulting from these may be suppressed or minimised, and this gain in surface area allows a higher speed and a lower power consumption to be obtained.

The predefined value towards which the amplitude of the injected calibration signal converges may be zero. Thus, the bias is substantially removed from the signal path of the modulator after completion of the calibration.

Alternatively, the predefined value towards which the amplitude of the injected calibration signal converges is non-zero, for example being equal to a constant.

The invention allows a whitening of the noise (or "dithering") without overly interfering with the useful signal, notably when the order of the loop filter that conventionally comprises the Delta-Sigma modulator is low or else when the number of levels of quantization of the analogue-digital converter is low.

The method according to the invention may be applied sequentially to each active elementary cell. Alternatively, the method is applied randomly to each active elementary cell. This allows the appearance of undesirable peaks in the output frequency spectrum of the modulator to be avoided.

The reference cell may be chosen from amongst one of the active source cells. The reference cell may be dedicated to the calibration of the active source cells, not being used for generating the return signal from one of the input bits.

Having a dedicated reference cell simplifies the implementation of the method and can improve the resolution of the converter.

The converter may comprise an assembly of source cells formed from an additional source cell and at least as many active source cells as input bits of the converter coupled to the output of the modulator, the additional source cell receiving at its input one of the calibration sequence and the complementary calibration sequence during the calibration. The additional source cell allows the reduction in the resolution of the converter during the calibration to be avoided, and the number of bits of the return converter may remain unchanged.

The additional source cell may be chosen randomly or sequentially from amongst the said assembly of source cells.

The reference cell may be dedicated to the calibration of all the active source cells and not be used for generating the modulator return signal from one of the input bits coupled to the output of the modulator.

The converter may comprise an assembly of source cells formed of an additional source cell and of as many active source cells as input bits of the converter coupled to the output ($M_{out}$) of the modulator, the additional source cell receiving either the calibration sequence (pr) or the complementary calibration sequence ($\overline{pr}$) and the reference cell receiving the complementary sequence from the one received by the additional source.

With respect to a design with no calibration, the converter may comprise two additional source cells: the dedicated reference cell and the additional source cell. These are advantageously two cells of the same nature. Thus, the calibration signal is subtracted perfectly in the steady state and there is no need to provide any additional dynamic range at the input of the converter.

The spectral power distribution of the calibration sequence may be centred on a frequency outside of a band of the modulator's input signal. The spectral power distribution may be centred around at least one predefined frequency.

The calibration sequence may be periodic. Alternatively, the calibration sequence may be random. Alternatively, the calibration sequence may be pseudo-random, being generated, for example, starting from a pseudo-random binary sequence.

Since the modulator uses a clock signal, the pseudo-random signal may be obtained by dividing the clock signal of the modulator either by N1 or by N2 depending on the value of the pseudo-random binary sequence, N1 and N2 being different numbers, for example different integer numbers.

The spectral power density of the pseudo-random signal may thus be centred on a frequency outside of the bandwidth of the input signal of the modulator, which may not then overly polluted by this noise.

The matching signal may be generated from a correlation between the calibration sequence and the output signal of the modulator.

The quantity produced by the correlation may be integrated in order to generate the matching signal.

At least one of the calibration sequence and of the output signal of the modulator may undergo a filtering, for example a bandpass filtering, then a decimation, prior to the correlation. The decimation offers the advantage of reducing the sampling rate for the correlator and the integrator, and leads to a calculation process that is more economical in processing power.

The calibration of the active sources may thus be carried out by means of a closed-loop control composed of:
- a correlator with at least one upstream bandpass filter,
- an integrating filter,
- a source to be calibrated and a reference source, together delivering the calibration error signal $I_{dac}$ by difference of their respective outputs $I_{cali}$ and $I_{ref}$,
- the modulator, used here for digitizing the signal $I_{dac}=I_{cali}-I_{ref}$.

This loop may be of the first order. The unity gain frequency of this closed-loop control may be set by adjusting the gain of the integrator.

The unity gain frequency of the loop may be low for a greater filtering of the interference associated with the input useful signal Vin. This is possible because the calibration circuit essentially compensates for static, or very slow, errors associated with the aging of the components or with temperature variations.

As the modulator digitizes the calibration signal, since pr=+/−1, then $$K=M_{out}\cdot pr=\alpha[(I_{cali}-I_{ref})\cdot pr]\cdot pr=\alpha(I_{cali}-I_{ref}),$$
since $pr^2=1$ $M_{out}$ denotes the output of the modulator, and pr the calibration sequence, as detailed hereinbelow.

The aforementioned filtering may be carried out by a bandpass filter centred on $f_{clk}*(N1+N2)/(2*N1*N2)$, $f_{clk}$ being the clock frequency of the modulator.

The input signal of the modulator, constituting a source of noise for the correlator, is thus filtered in order to reduce the number of averaging operations needed to bring the calibration signal to tend towards a predefined value, notably zero, as detailed hereinbelow. In the case where the two signals—calibration and output of the modulator—are filtered, the filter applied to the calibration sequence may cause the same phase delay as the filter applied to the output signal of the modulator, in order not to bias the correlator.

The active elementary source cells may be current generators, for example current sources.

The active elementary source cells may each comprise an addressable memory for storing a value of the matching signal.

Advantageously, as mentioned hereinabove, the calibration is carried out as a background task during the processing of the useful signal at the input of the modulator.

The matching signal may be transmitted in digital form to the active elementary source cells.

The number of active elementary source cells used to generate the return signal from the input bits of the main converter may be greater than or equal to 2, for example in the range between 2 and 64, notably equal to 32.

The greater the number of elementary cells, the lower will be the quantization noise generated by the analogue-digital conversion.

According to another aspect of the invention, there is provided a Multi-bit Delta-Sigma modulator comprising:
- a main return loop multi-bit digital-analogue converter for generating a modulator return signal to be subtracted from an input of the modulator, the main converter comprising a plurality of elementary source cells at least some of which, referred to as active cells, are associated with a plurality of input bits of the converter coupled to an output signal of the modulator, for generating the modulator return signal, the output level of each active source cell being adjustable under the action of a matching signal;
- a control circuit for selecting a cell to be calibrated from amongst the active source cells, the selected source cell and a reference source each being controllable by complementary signals based on a calibration sequence in such a manner as to inject into the modulator return signal a calibration signal whose amplitude decreases with the matching between the selected source cell and the reference source cell; and
- a calibration circuit for generating the matching signal to be sent to the selected source cell to be calibrated, the calibration circuit operable to receive the output signal from the modulator at its input, the calibration circuit comprising a generator for generating the calibration sequence, wherein the calibration circuit is operable to generate the calibration sequence and to generate the matching signal by processing of the output signal of the modulator in such a manner as to make the amplitude of the calibration signal converge towards a predefined limit value.

Such a modulator is suitable for the implementation of the method defined hereinabove. Thus, the control circuit may be configured for applying the calibration sequence sequentially or randomly to each active source cell.

The converter may comprise a reference cell dedicated to the calibration and other than the active source cells.

The converter may comprise an assembly of source cells comprising an additional source cell and as many source cells as there are input bits of the converter coupled to the output of the modulator. The additional source cell may be operable to receive either the calibration sequence (pr) or the complementary calibration sequence ($\overline{pr}$). The reference cell may be operable to receive the complementary sequence from the one received by the additional source cell.

The calibration sequence may be chosen so that a spectral distribution of its power is centred on a frequency outside of the band of the modulator's input signal. The spectral distribution may be centred around at least one predefined frequency.

Advantageously, the calibration sequence is pseudo-random, generated starting from a pseudo-random binary sequence, the modulator using a clock signal, the pseudo-random signal being obtained by dividing the clock signal of the modulator either by N1 or by N2 depending on the value of the pseudo-random binary sequence, N1 and N2 being two different numbers, notably integers, the matching signal being generated from a correlation between the calibration sequence and the output signal of the modulator, the quantity produced by the correlation being integrated in order to generate the matching signal, at least one of the calibration sequence and of the output signal of the modulator undergoing a bandpass filtering then a decimation, prior to the correlation, the filtering being carried out by a bandpass filter centred on $f_{clk}$ (N1+N2)/(2*N1*N2), $f_{clk}$ being the clock frequency of the modulator.

The active source cells may each comprise a memory element for storing a value of the matching signal, the matching signal being transmitted in digital form to the source cells.

The control circuit may be configured for carrying out the calibration as a background task during the processing of the useful signal at the input of the modulator.

The active source cells may comprise a local digital-analogue converter.

According to a further aspect of the invention, there is provided an adjustable source cell of a main multi-bit digital-analogue converter of a main return loop of a Delta- Sigma modulator according to any one of Claims 9 to 14, the cell comprising a local digital-analogue converter comprising:

an inverter having as input one of the input bits of the main converter, and being powerable by high and low voltages;

a high adjustment set comprising transistors, installed between a high reference voltage and the high voltage power supply of the inverter, the transistors being controllable by a matching signal;

a low adjustment set, comprising transistors, installed between a low reference voltage and the low power supply voltage of the inverter, the transistors being controllable by the matching signal;

the high and low adjustment sets being implemented in such a manner that, depending on the transistor that is activated, the output high and low level of the inverter is different.

The implementation as a CMOS inverter offers advantages in terms of speed and of energy efficiency.

The high adjustment set may comprise an assembly of PMOS transistors, for example configured in parallel with one another, their gates receiving a first control signal depending on the matching signal, these transistors being for example installed between the high reference voltage and the high voltage power supply of the inverter.

The low adjustment set may comprise an assembly of NMOS transistors, for example configured in parallel with one another, their gates receiving a second control signal depending on the matching signal, these transistors being for example installed between the low reference voltage and the low power supply voltage of the inverter.

The second control signal may be the logical complement of the first control signal.

The high or low adjustment set may comprise several parallel branches of transistors in series.

The adjustment set may comprise several branches each composed of a transistor, controlled by a thermometric code and several branches each composed of at least two transistors in series, controlled by a binary code.

A digital code is said to be "thermometric" when all the bits have the same weighting. A digital code is said to be "binary" when all the bits have a different weighting.

The transistors of an adjustment set may be identical.

The topology of the high adjustment set may be similar or even identical to the topology of the low adjustment set, so as to exhibit substantially the same equivalent resistance. For this purpose, the ratio between the sizes W/L of the PMOS and NMOS transistors may be adjusted. Typically, the PMOS transistors have a size ratio of around 2.5 times greater than that of the NMOS so as to compensate for their lower mobility.

The drain-source resistance, referred to as $R_{ds\_ON}$ resistance, of the assemblies of transistors of the adjustment sets may be controlled by the matching signal for compensating the mismatch errors between the resistances of the local digital-analogue converters.

Yet another subject of the invention, independently or in combination with what is described hereinabove, is a multi-bit Delta-Sigma modulator comprising:

a main return loop multi-bit digital-analogue converter for generating a return signal subtracted from the input of the modulator, the main converter comprising n active elementary source cells associated with the various input bits of the converter for generating the return signal, the output level of each active source cell being adjustable under the action of a matching signal, a reference source cell, an additional source cell, a control circuit for selecting a cell to be calibrated from amongst the active source cells and the additional source cell, and controlling the reference source cell and the source cell to be calibrated in such a manner as to adjust the source cell to be calibrated so as to minimize a calibration error between the reference source cell and the source cell to be calibrated.

The modulator according to this aspect of the invention offers the advantage of conserving n active sources in order to ensure the normal operation of the converter without loss of resolution, the two additional sources being used in a background task for providing the calibration of the modulator and correcting any mismatching appearing for example subsequent to the aging of the components or to variations in temperature. The modulator may exhibit any one of the aforementioned features. In particular, the control circuit may be configured for sequentially or randomly selecting the active sources other than the reference source, in order to successively calibrate them.

The invention will be better understood upon reading the description that follows of non-limiting exemplary embodiments of the latter, and upon examining the appended drawings, in which.

Figure 1:
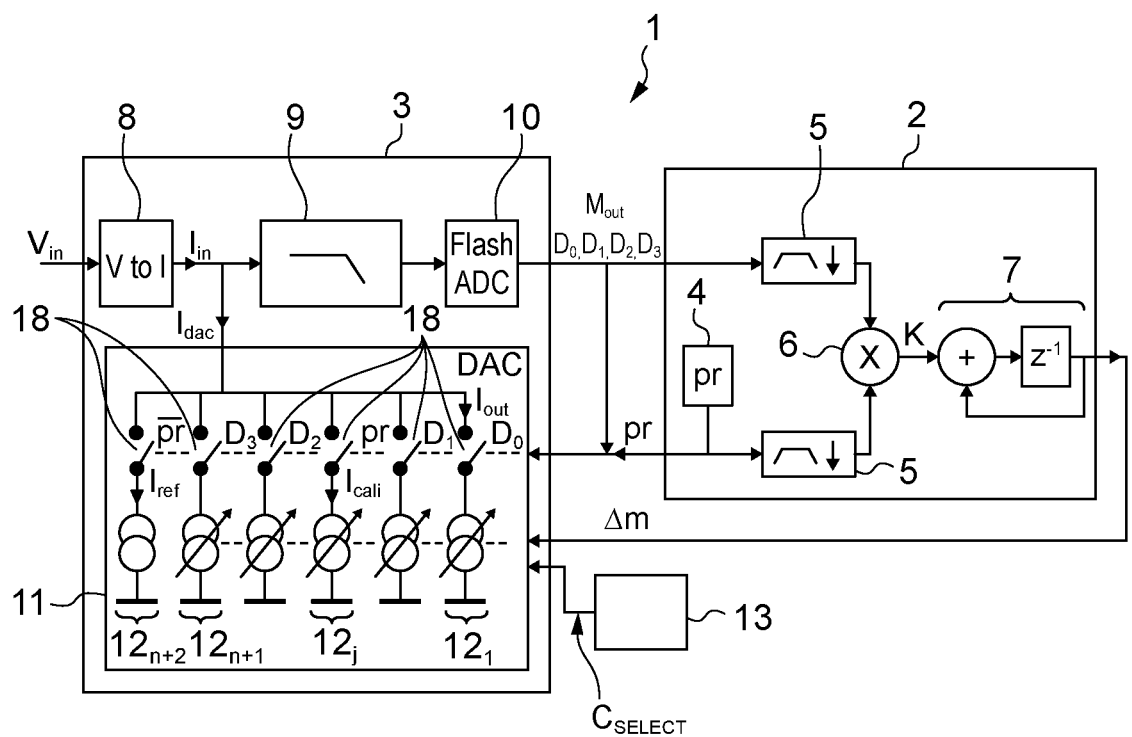
FIG. 1 shows schematically one example of a Delta-Sigma modulator according to the invention.

FIG. 1 shows, in a schematic and partial manner, a multi-bit Delta-Sigma modulator 1 according to the invention. In this example, for the sake of simplicity of the diagram, the modulator has a resolution of 4 thermometric bits. However, in practice, the modulator may have a higher resolution.

The modulator 1 comprises a sub-modulator 3, a calibration circuit 2 and a control circuit 13 for selecting the cell to be calibrated. The sub-modulator 3 has as inputs the input voltage $V_{in}$ to be digitized, a calibration sequence pr and a matching signal Δm, the calibration sequence pr, the matching signal Δm coming from the calibration circuit 2 and a cell selection signal $C_{select}$ from the control circuit 13. The sub-modulator 3 has as output a digital signal $M_{out}$ in the form of a digital code composed of n bits ($D_0$, ..., $D_{n-1}$, i.e. $D_0$ to $D_3$ for n=4) resulting from the digitization. This signal $M_{out}$ is injected into the input of the calibration circuit 2 and fed back to the sub-modulator 3.

The sub-modulator 3 comprises, in this example, a transconductance 8 transforming the input voltage $V_{in}$ into a current $I_{in}$. The sub-modulator 3 comprises, in this example, a low-pass filter 9 followed by an analogue-digital converter 10, for example of the Flash type, and a main return loop digital-analogue converter 11 supplying a current $I_{dac}$. The filter 9 integrates the difference ($I_{in}-I_{dac}$) which is subsequently converted into a digital code ($D_0, \ldots, D_{n-1}$). This code is thermometric.

The main return loop digital-analogue converter 11 comprises n+2 elementary source cells $12_k$, $1<=k<=n+2$, n and k being positive integer numbers. In the example illustrated, these source cells correspond to current sources, but voltage sources may be used.

Each active cell $12_k$, for $1<=k<=n+1$, comprises an adjustable current source that may be adjusted by the matching signal $\Delta m$. Electronic switches $18_k$ are associated with the cells and controlled by respective bits $D_0, \ldots, D_{n-1}$ of the signal $M_{out}$. In this example, there are four active sources ($12_1, \ldots, 12_4$) corresponding to the four bits of the code at the output ($D_0, \ldots, D_3$), and two additional sources. These additional sources are a reference source $12_{n+2}$ (noting that n=4 in this embodiment, hence reference source $12_{n+2}$ may also be referred to as reference source $12_6$) and an additional source, allowing four sources to be used for generating the useful signal, chosen from amongst the (4+1) sources, while the unused source $12_j$ from amongst these (4+1) sources for generating the useful signal is calibrated. This source $12_j$ is referred to as the source under calibration.

The current at the output $I_{cali}$ of the cell under calibration $12_j$ is equal to $I_{ref}(1+\delta)$, $I_{ref}$ being the current of the reference source $12_{n+2}$ and $\delta$ being the relative value of deviation with respect to the reference source. The switch $18_j$ of the cell under calibration $12_j$ is controlled by the calibration sequence pr, which is, for example, pseudo-random.

The reference source $12_{n+2}$ comprises a fixed current source and the corresponding switch is controlled by the complementary signal of pr (i.e. $\overline{pr}$).

The correction of the mismatch errors is carried out by injecting into the return signal $I_{dac}$ a calibration signal equal to $pr \cdot (I_{cali}-I_{ref})$. The amplitude of this signal decreases with the matching between the cell under calibration $12_j$ and the reference cell $12_{n+2}$.

For the processing of the useful signal, n sources are active and controlled by the signal $D_0, \ldots, D_{n-1}$.

It can be seen in FIG. 1 that the cell under calibration $12_j$ receives the signal pr, whereas the cell $12_{n+1}$ receives the signal corresponding to the bit $D_{n-1}$ (i.e. $D_3$ with N=4 in the exemplary embodiment).

Figures 2, 4:
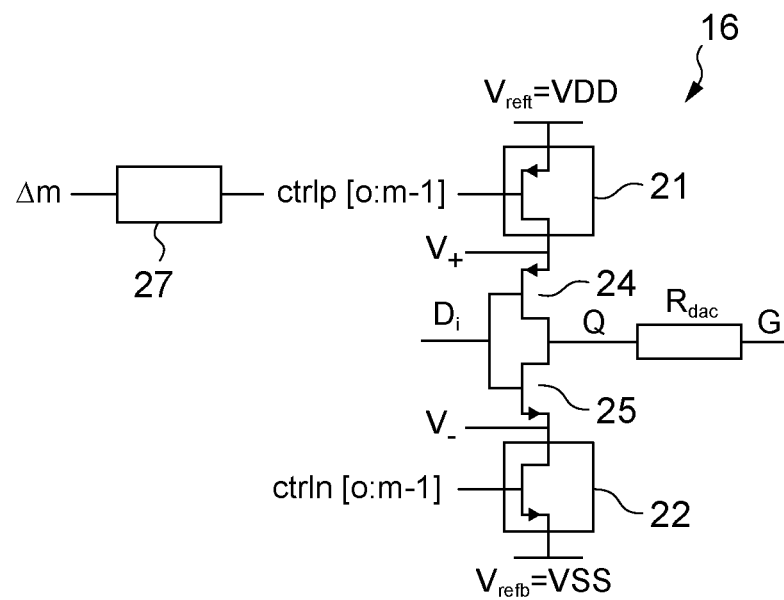
FIG. 2 illustrates an example of selection of the active source cell to be calibrated.
FIG. 4 shows one example of an implementation in CMOS of a local digital-analogue converter of an active current source cell.

FIG. 2 is a table where l corresponds to the position of the cell and c corresponds to a phase of operation of the digital-analogue converter. It is assumed that the reference cell controlled by the complementary signal of pr ($\overline{pr}$) is fixed and remains at the sixth position (l=6). In the first phase (c=1), the third cell (l=3) is that under calibration, which corresponds to FIG. 1. The cell occupying the fourth position (l=4), controlled by $D_2$ at c=1, is subsequently selected for calibration. Therefore, in the following phase, the signal pr is directed towards this cell, whereas the bit $D_2$ replaces pr which was at the third position at c=1. In the following, the fifth cell (l=5) is selected for calibration at c=3, pr is then directed towards this cell, and the bit $D_3$ is directed towards the cell that was under calibration in the preceding cycle.

The modulator thus comprises a control circuit 13, shown schematically in FIG. 1, for selecting the cell to be calibrated from amongst the active source cells.

The choice of the cell under calibration may be random or sequential.

The calibration circuit 2 comprises a generator 4 of the calibration sequence pr. This signal pr and the output digital code $M_{out}$ undergo a bandpass filtering, then a decimation, by means of a decimator bandpass filter 5, prior to being correlated by a multiplier 6. The result K of the multiplication is equal to:

$$M_{out} \cdot pr = I_{in} \cdot pr + I_{ref} \delta,$$

given that $M_{out}=I_{in}-I_{dac}=I_{in}-pr \cdot I_{ref}+I_{cali} \cdot pr = I_{in}+I_{ref}\delta \cdot pr$ and that $pr=+/-1$ for a pseudo-random signal. Therefore, $K \rightarrow I_{ref}\delta$ when $t \rightarrow \infty$.

K is subsequently integrated by an integrator 7 in order to yield the matching signal $\Delta m$.

The pseudo-random signal pr may be obtained from a pseudo-random binary sequence PRBS generator and from the clock signal clk of the modulator.

In order for the spectral power density of the pseudo-random signal pr to be centred on a frequency outside of the band of the useful signal of the modulator, the pseudo-random signal may be obtained by dividing the clock signal clk of the modulator either by N1 or by N2 depending on the value of the pseudo-random binary sequence PRBS, N1 and N2 being, in the current example, different positive integer numbers. Thus, the noise density on the signal pr is centred on $f_{clk}*(N1+N2)/(2*N1*N2)$, $f_{clk}$ being the clock frequency of the modulator.

Figure 6:
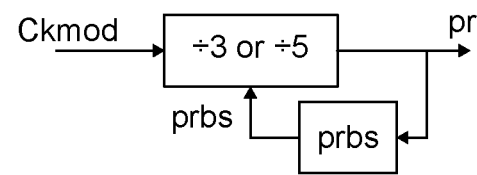
FIG. 6 is a diagram illustrating the generation of the calibration sequence in the case where the latter is pseudo-random.
Figure 7:
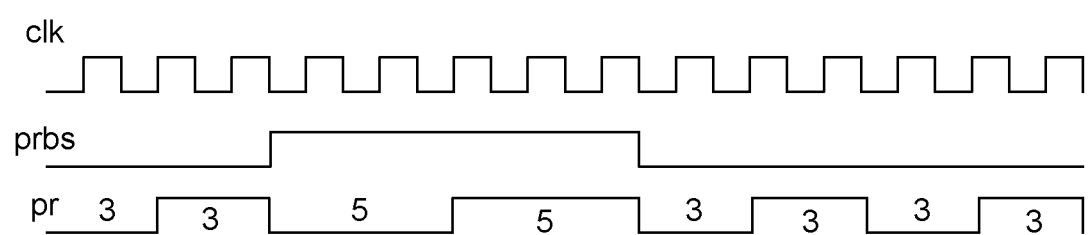
FIG. 7 shows the timing diagrams of the signals in FIG. 6.

For example, in FIG. 6, N1=3 and N2=5. The diagram in FIG. 6 is based on a fractional divider, such as those used in fractional phase-locked loop circuits for example. The corresponding timing diagrams are given in FIG. 7, where it can be seen that, when PRBS=0, the signal pr is obtained from the signal clk divided by 3, and when PRBS=1, the signal pr is obtained from the signal clk divided by 5.

Figure 3:
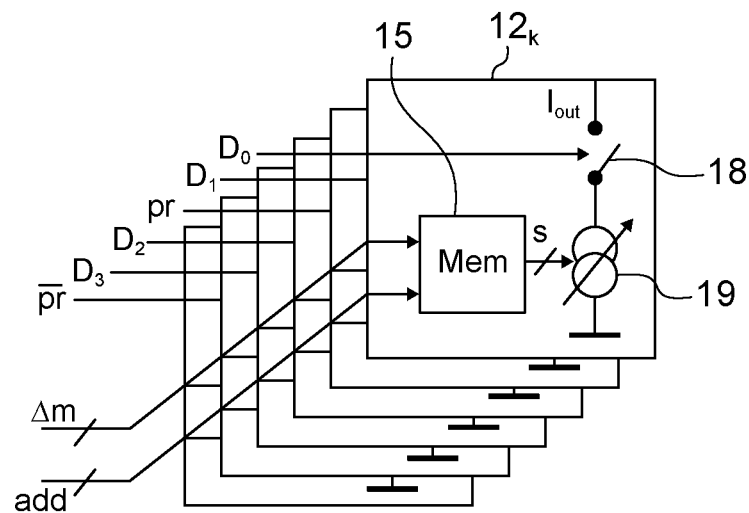
FIG. 3 shows schematically an exemplary structure of an active current source cell.

An active elementary source cell $12_k$ is shown in FIG. 3. It comprises an addressable memory 15 for storing a value of the matching signal $\Delta m$. The signal s at the output of the memory 15 acts on a variable current source 19. This variable current source comprises a local digital-analogue converter.

FIG. 4 shows schematically one exemplary embodiment of this digital-analogue converter local 16. The latter comprises an CMOS inverter composed of a PMOS transistor 24 and of a NMOS transistor 25. Their gates are controlled by an input signal $D_i$ and their drains are connected to a terminal Q of a resistor $R_{dac}$ of the local converter. It is also envisaged that the converter may be controlled by the calibration sequence pr or the complimentary calibration sequence ($\overline{pr}$).

A high adjustment set 21, composed for example of PMOS transistors in parallel with one another, is connected in series with the PMOS transistor 24. This transistor set 21 is connected to the source of the transistor 24, defining the high power supply voltage V+ of the inverter, and is furthermore connected to the high reference voltage such as a positive power supply voltage $V_{DD}$. The gates of the transistors of the transistor set 21 receive a first control signal ctrlp [0:m−1] which is for example a thermometric word of length m, m being the number of transistors in the transistor set 21. Each of the bits of ctrlp controls a gate of a transistor of the transistor set 21. The signal ctrlp is a code obtained at the output of a decoder 27 receiving at its input the matching signal $\Delta m$.

In a symmetrical manner, a low adjustment set 22 of NMOS transistors in parallel with one another is connected in series with the NMOS transistor 25. This transistor set 22 is connected to the source of the transistor 25, defining the low power supply voltage V− of the inverter, and are also connected to a low reference voltage such as the negative power supply voltage $V_{ss}$. The gates of the transistors of the transistor set 22 receive a second control signal ctrln [0:m−

1] which is for example a thermometric word of length m, m being the number of transistors in the transistor set 22. Each of the bits of ctrln controls a gate of a transistor 22. The signal ctrln is the complement of the signal ctrlp.

The resistances $R_{ds\_ON}$ of the transistors of these two sets of transistors 21 and 22 are adjusted by the matching signal Δm in order to compensate the mismatch errors between the resistors $R_{dac}$ of the local digital-analogue converters 16.

When the transistors, which may be identical, of an adjustment set are in parallel with one another, the equivalent resistance is the resistance $R_{ds\_ON}$ of a transistor divided by the number of transistors activated by the control signal.

Figure 5:
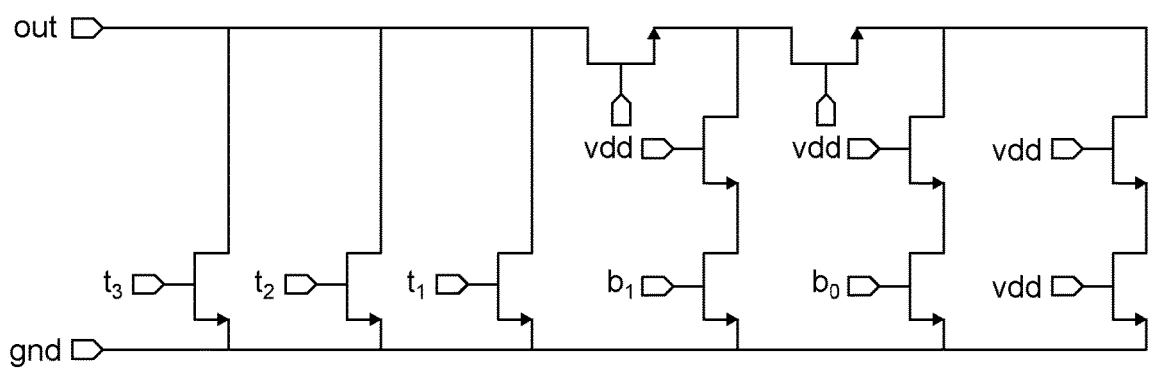
FIG. 5 illustrates schematically one example of an adjustment set comprising several parallel branches.

The high adjustment set 21 or low set 22 may comprise several parallel branches of transistors connected together as illustrated in FIG. 5.

The topology of the set is for example of the segmented DAC type, with most significant bits t1-t3 being thermometric bits and with least significant bits b0-b1 being binary bits, in a R-2R structure, as illustrated.

Accordingly, there has been described a method for calibrating a multi-bit Delta-Sigma modulator comprising at least one main multi-bit digital-analogue converter in the return loop for generating a return signal subtracted from the input of the modulator, the main converter comprising a plurality of elementary source cells at least some of which, referred to as active cells, are associated with the various input bits of the converter for generating the return signal, the output level of these active source cells being adjustable under the action of a matching signal, the matching signal coming from a calibration circuit receiving an output signal from the modulator at its input, this calibration circuit comprising a generator of a calibration sequence.

Aspects of the invention are set out in the following series of numbered clauses.

1. Method for calibrating a multi-bit Delta-Sigma modulator comprising at least one main multi-bit digital-analogue converter in the return loop (11) for generating a return signal ($I_{dac}$) subtracted from the input of the modulator, the main converter (11) comprising a plurality of elementary source cells at least some of which, referred to as active cells ($12_1, \ldots, 12_n$), are associated with the various input bits ($D_0, \ldots, D_{n-1}$) of the converter for generating the return signal, the output level of these active source cells being adjustable under the action of a matching signal (Δm), the matching signal coming from a calibration circuit (2) receiving an output signal from the modulator at its input ($M_{out}$), this calibration circuit (2) comprising a generator of a calibration sequence (pr), method in which, given a reference cell, a cell to be calibrated ($12_j$) is selected from amongst the active source cells, the selected source cell and the reference cell being controlled from the calibration sequence (pr) in such a manner as to inject into the return signal a calibration signal whose amplitude decreases with the matching between the selected source cell and the reference cell thus controlled, and in which the matching signal (Δm) sent to the active cell in the process of being calibrated is generated by processing of the output signal of the modulator ($M_{out}$) and of the calibration sequence (pr) in such a manner as to make the amplitude of the injected calibration signal converge towards a predefined value.

2. Method according to the preceding clause, the predefined value being zero.

3. Method according to Clause 1, the predefined value being non-zero.

4. Method according to any one of the preceding clauses, being applied sequentially to each active elementary cell.

5. Method according to any one of Clauses 1 to 3, being applied randomly to each active elementary cell.

6. Method according to any one of the preceding clauses, the reference cell ($12_{n+2}$) being chosen from amongst one of the active source cells.

7. Method according to any one of Clauses 1 to 5, the reference cell ($12_{n+2}$) being dedicated to the calibration of all the active source cells and not being used for generating the return signal from one of the input bits ($D_0, \ldots, D_{n-1}$).

8. Method according to any one of the preceding clauses, the converter comprising an assembly of source cells formed of an additional source cell ($12_{n+1}$) and of as many active source cells as input bits of the converter, the input bit of the active source cell selected for the calibration being directed towards this additional cell, during the calibration of the selected active source cell.

9. Method according to the preceding clause, the additional source cell being chosen randomly or sequentially from amongst the said assembly of source cells.

10. Method according to any one of the preceding clauses, the calibration sequence (pr) being chosen so that the spectral power distribution is mainly situated outside of the bandwidth of the modulator, being preferably centred around at least one predefined frequency.

11. Method according to any one of the preceding clauses, the calibration sequence (pr) being periodic.

12. Method according to any one of Clauses 1 to 10, the calibration sequence (pr) being pseudo-random.

13. Method according to Clause 12, the calibration sequence (pr) being generated from a pseudo-random binary sequence (PRBS).

14. Method according to Clause 13, the modulator comprising a clock generating a clock signal (clk), the pseudo-random signal (pr) being obtained by dividing the clock signal (clk) of the modulator either by N1 or by N2 depending on the value of the pseudo-random binary sequence (PRBS), N1 and N2 being two different integer numbers.

15. Method according to any one of the preceding clauses, the matching signal being generated from a correlation between the calibration sequence (pr) and the output signal of the modulator ($M_{out}$).

16. Method according to the preceding clause, the quantity coming from the correlation being integrated in order to generate the matching signal (Δm).

17. Method according to either of Clauses 15 and 16, at least one of the calibration sequence (pr) and of the output signal of the modulator ($M_{out}$) undergoing a filtering, preferably bandpass, then a decimation, prior to the correlation.

18. Method according to Clause 17, the filtering being carried out by a bandpass filter centred on $f_{clk}*(N1+N2)/(2*N1*N2)$, $f_{clk}$ being the clock frequency of the modulator.

19. Method according to any one of the preceding clauses, the active elementary source cells being current sources.

20. Method according to any one of the preceding clauses, the active elementary source cells each comprising an addressable memory element (15) for storing a value of the matching signal (Δm).

21. Method according to any one of the preceding clauses, the calibration being carried out as a background task during the processing of the useful signal at the input of the modulator.

22. Method according to any one of the preceding clauses, the matching signal (Δm) being transmitted in digital form to the active elementary source cells.

23. Method according to any one of the preceding clauses, the number (n) of active elementary source cells used to generate the return signal ($I_{dac}$) from the input bits ($D_0, \ldots, D_{n-1}$) of the main converter being greater than or equal to 2, preferably in the range between 2 and 64, notably equal to 32.

24. Multi-bit Delta-Sigma modulator (1) comprising:
a main return loop multi-bit digital-analogue converter (11) for generating a return signal subtracted from the input of the modulator, the main converter comprising a plurality of elementary source cells at least some of which, referred to as active cells ($12_1, \ldots, 12_n$), are associated with the various input bits ($D_0, \ldots, D_{n-1}$) of the converter for generating the return signal, the output level of each active source cell being adjustable under the action of a matching signal ($\Delta m$),
a control circuit (13) for selecting a cell to be calibrated ($12_j$) from amongst the active source cells, the selected source cell and a reference source ($12_{n+2}$) being controlled from the calibration sequence (pr) in such a manner as to inject into the return signal a calibration signal whose amplitude decreases with the matching between the selected active cell ($12_j$) and the reference source cell ($12_{n+2}$),
a calibration circuit (2) for generating the matching signal ($\Delta m$) sent to the active cell in the process of being calibrated, receiving an output signal from the modulator at its input ($M_{out}$), this calibration circuit (2) comprising a generator of a calibration sequence (pr), the matching signal ($\Delta m$) sent to the active cell in the process of being calibrated being generated by processing of the output signal ($M_{out}$) of the modulator and of the calibration sequence (pr) in such a manner as to make the amplitude of the calibration signal converge towards a predefined value, preferably zero.

25. Modulator (1) according to Clause 24, the control circuit (13) being configured for applying the calibration sequence sequentially or randomly to each active source cell.

26. Modulator (1) according to either of Clauses 24 and 25, the converter (11) comprising a reference cell ($12_{n+2}$) dedicated to the calibration and other than the active source cells.

27. Modulator (1) according to any one of Clauses 24 to 26, the converter (11) comprising an assembly of source cells comprising an additional source cell ($12_{n+1}$) and as many source cells ($12_1, \ldots, 12_n$) as there are input bits of the converter, in such a manner that this additional source cell ($12_{n+1}$) can receive the input bit of the active source cell selected for calibration, during the calibration of the latter.

28. Modulator (1) according to any one of Clauses 24 to 27, the calibration sequence (pr) being chosen so that the spectral distribution of its power is mainly situated outside of the bandwidth of the modulator, being preferably centred around at least one predefined frequency.

29. Modulator (1) according to any one of Clauses 24 to 28, the calibration sequence (pr) being pseudo-random, generated from a pseudo-random binary sequence (PRBS), the modulator comprising a clock generating a clock signal (clk), the pseudo-random signal (pr) being preferably obtained by dividing the clock signal (clk) of the modulator either by N1 or by N2 depending on the value of the pseudo-random binary sequence (PRBS), N1 and N2 being two different numbers, the matching signal being preferably generated from a correlation between the calibration sequence (pr) and the output signal of the modulator ($M_{out}$), the quantity coming from the correlation being integrated in order to generate the matching signal ($\Delta m$), at least one of the calibration sequence (pr) and of the output signal of the modulator ($M_{out}$) undergoing a filtering, preferably bandpass, then a decimation, prior to the correlation, the filtering preferably being carried out by a bandpass filter centred on $f_{clk}*(N1+N2)/(2*N1*N2)$, $f_{clk}$ being the clock frequency of the modulator.

30. Modulator (1) according to any one of Clauses 24 to 29, the active source cells each comprising an addressable memory (15) for storing a value of the matching signal ($\Delta m$), the matching signal ($\Delta m$) being transmitted in digital form to the source cells.

31. Modulator (1) according to any one of Clauses 24 to 30, the control circuit being configured for carrying out the calibration as a background task during the processing of the useful signal at the input of the modulator.

32. Modulator (1) according to any one of Clauses 24 to 31, the active source cells comprising a local digital-analogue converter (16).

33. Adjustable source cell ($12_k$) of a main multi-bit digital-analogue converter (11) of a main return loop of a Delta-Sigma modulator (1), notably a modulator according to any one of Clauses 24 to 32, the cell comprising a local digital-analogue converter (16) comprising:
an inverter (24, 25) having as input one of the input bits ($D_0, \ldots, D_3$) of the main converter (11), and being powered by high (V+) and low (V−) voltages;
a high adjustment set (21) comprising transistors, installed between a high reference voltage ($V_{reft}$) and the high voltage power supply (V+) of the inverter, the transistors being controlled by a matching signal ($\Delta m$);
a low adjustment set (22), comprising transistors, installed between a low reference voltage ($V_{refb}$) and the low power supply voltage (V−) of the inverter, the transistors being controlled by the matching signal ($\Delta m$);
the high and low adjustment sets being implemented in such a manner that, depending on the transistor that is controlled, the output high and low level of the inverter is different.

34. Cell according to the preceding clause, the high adjustment set (21) comprising an assembly of PMOS transistors, notably configured in parallel with one another, their gates receiving a first control signal (ctrlp) depending on the matching signal ($\Delta m$), these transistors being installed between the high reference voltage ($V_{reft}$) and the high voltage power supply (V+) of the inverter.

35. Cell according to either of the two preceding clauses, the low adjustment set (22) comprising an assembly of NMOS transistors, notably configured in parallel with one another, their gates receiving a second control signal (ctrln) depending on the matching signal ($\Delta m$), these transistors being installed between the low reference voltage ($V_{refb}$) and the low power supply voltage (V−) of the inverter.

The invention is not limited to the examples described hereinabove. In the figures, for the sake of simplicity, only a structure with a single output of the modulator (known as a "single-ended" structure) has been shown, but a differential (or "double-ended") structure of the modulator is also perfectly possible.

The invention claimed is:
1. A method for calibrating a multi-bit Delta-Sigma modulator comprising at least one main multi-bit digital-analogue converter (11) in a return loop for generating a modulator return signal ($I_{dac}$) to be subtracted from an input of the modulator, the main converter (11) comprising a plurality of elementary source cells, at least some of which, referred to as active cells ($12_1, \ldots, 12_n$), are associated with a plurality of input bits ($D_0, \ldots, D_{n-1}$) of the converter coupled to an output signal ($M_{out}$) of the modulator for generating the modulator return signal, the output level of the active source cells being adjustable under the action of a matching signal (Δm), the matching signal coming from a calibration circuit (2) that receives the output signal ($M_{out}$) from the modulator at its input, the calibration circuit (2) comprising a generator of a calibration sequence (pr), method in which, given a reference cell, a cell to be calibrated ($12_j$) is selected from amongst the active source cells, the selected source cell and the reference cell being controlled by complementary signals based on the calibration sequence (pr) in such a manner as to inject into the modulator return signal a calibration signal whose amplitude decreases with the matching between the selected source cell and the reference cell thus controlled, and in which the matching signal (Δm) sent to the selected source cell to be calibrated is generated by processing of the output signal ($M_{out}$) of the modulator and of the calibration sequence (pr) in such a manner as to make the amplitude of the injected calibration signal converge towards a predefined limit value.

2. The method according to claim 1, the predefined value being non-zero.

3. The method according to claim 1, the reference cell being dedicated to the calibration of all the active source cells and not being used for generating the modulator return signal from one of the input bits ($D_0, \ldots, D_{n-1}$) coupled to the output ($M_{out}$) of the modulator.

4. The method according to claim 1, the converter comprising an assembly of source cells formed of an additional source cell and of as many active source cells as input bits of the converter coupled to the output ($M_{out}$) of the modulator, the additional source cell receiving either the calibration sequence (pr) or the complementary calibration sequence (pr) and the reference cell receiving the complementary sequence from the one received by the additional source.

5. The method according to claim 1, wherein a spectral power distribution of the calibration sequence (pr) is centred on a frequency outside of a band of the modulator's input.

6. The method according to claim 1, the calibration sequence (pr) being one of periodic, random or pseudo-random.

7. The method according to claim 1, the active elementary source cells being current generators.

8. The method according to claim 1, the active source cells each comprising an addressable memory element (15) for storing a value of the matching signal (Δm).

9. A multi-bit Delta-Sigma modulator comprising:
a main return loop multi-bit digital-analogue converter (11) for generating a modulator return signal
to be subtracted from an input of the modulator, the main converter comprising a plurality of elementary source cells at least some of which, referred to as active cells ($12_1, \ldots, 12_n$), are associated with a plurality of input bits ($D_0, \ldots, D_{n-1}$) of the converter coupled to an output signal ($M_{out}$) of the modulator, for generating the modulator return signal, the output level of each active source cell being adjustable under the action of a matching signal (Δm);
a control circuit (13) for selecting a cell to be calibrated ($12_j$) from amongst the active source cells, the selected source cell and a reference cell ($12_{n+2}$) each being controllable by complementary signals based on a calibration sequence (pr) in such a manner as to inject into the modulator return signal a calibration signal whose amplitude decreases with the matching between the selected source cell ($12_j$) and the reference cell ($12_{n+2}$); and
a calibration circuit (2) for generating the matching signal (Δm) to be sent to the selected source cell to be calibrated, the calibration circuit operable to receive the output signal ($M_{out}$) from the modulator at its input, the calibration circuit (2) comprising a generator for generating the calibration sequence (pr), wherein the calibration circuit is operable to generate the calibration sequence (pr) and to generate the matching signal (Δm) by processing of the output signal ($M_{out}$) of the modulator in such a manner as to make the amplitude of the calibration signal converge towards a predefined limit value.

10. The modulator (1) according to claim 9, the reference cell dedicated to the calibration and other than the active source cells.

11. The modulator (1) according to claim 9, the converter (11) comprising an assembly of source cells comprising an additional source cell and as many source cells ($12_1, \ldots, 12_n$) as there are input bits of the converter coupled to the output ($M_{out}$) of the modulator, wherein the additional source cell is operable to receive either the calibration sequence (pr) or the complementary calibration sequence (pr) and wherein the reference cell is operable to receive the complementary sequence from the one received by the additional source cell.

12. The modulator (1) according to claim 9, the calibration sequence (pr) being chosen so that a spectral distribution of its power is centred on a frequency outside of the band of the modulator's input.

13. The modulator (1) according to claim 9, the active source cells each comprising an addressable memory (15) for storing a value of the matching signal (Δm), the matching signal (Δm) being transmitted in digital form to the source cells.

14. The modulator (1) according to claim 9, the active source cells comprising a local digital-analogue converter (16).

15. An adjustable source cell ($12_k$) of a main multi-bit digital-analogue converter (11) of a main return loop of a Delta-Sigma modulator (1) according to claim 9, the cell comprising a local digital-analogue converter (16) comprising:
an inverter (24, 25) having as input one of the input bits ($D_0, \ldots, D_3$) of the main converter (11), and being powerable by high (V+) and low (V−) voltages;
a high adjustment set (21) comprising transistors, installed between a high reference voltage ($V_{ref}$) and the high voltage power supply (V+) of the inverter, the transistors being controllably by a matching signal (Δm);
a low adjustment set (22), comprising transistors, installed between a low reference voltage ($V_{ref}$) and the low power supply voltage (V−) of the inverter, the transistors being controllable by the matching signal (Δm);
the high and low adjustment sets being implemented in such a manner that, depending on the transistor that is activated, the output high and low level of the inverter is different.

* * * * *